United States Patent
Kochupurackal et al.

(10) Patent No.: US 8,324,117 B2
(45) Date of Patent: Dec. 4, 2012

(54) METHOD OF FORMING A NANOCLUSTER-COMPRISING DIELECTRIC LAYER AND DEVICE COMPRISING SUCH A LAYER

(75) Inventors: Jinesh Balakrishna Pillai Kochupurackal, Singapore (SG); Willem Frederik Adrianus Besling, Eindhoven (NL); Johan Hendrik Klootwijk, Eindhoven (NL); Robert Adrianus Maria Wolters, Eindhoven (NL); Freddy Roozeboom, Waalre (NL)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 57 days.

(21) Appl. No.: 12/990,181

(22) PCT Filed: Apr. 22, 2009

(86) PCT No.: PCT/IB2009/051656
§ 371 (c)(1),
(2), (4) Date: Jan. 14, 2011

(87) PCT Pub. No.: WO2009/133500
PCT Pub. Date: Nov. 5, 2009

(65) Prior Publication Data
US 2011/0101471 A1 May 5, 2011

(30) Foreign Application Priority Data
Apr. 28, 2008 (EP) .................................... 08103751

(51) Int. Cl.
*H01L 29/772* (2006.01)
(52) U.S. Cl. .................. 438/785; 438/763; 438/778
(58) Field of Classification Search .................. 438/763, 438/778, 785
See application file for complete search history.

(56) References Cited

U.S. PATENT DOCUMENTS 6,875,678 B2 * 4/2005 Lee et al. ...................... 438/591
7,238,628 B2 * 7/2007 Demaray et al. .............. 438/785
(Continued)

OTHER PUBLICATIONS

International Searching Authority—European Patent Office, Authorized Officer Andreas Neumann, PCT International Search Report dated Jul. 14, 2009, International Application No. PCT/182009/051656, 4 pages, HV Rijswijk.
Elam J et al: "Mechanism for zirconium oxide atomic layer deposition using bis(methylcyclopentadienyl)methoxymethyl zirconium" Applied Physics Letters, AIP, American Institute of Physics, Melville, NY, US, vol. 91, No. 25, Dec. 20, 2007, pp. 253123-253123.

*Primary Examiner* — Eugene Lee
(74) *Attorney, Agent, or Firm* — Haynes and Boone, LLP

(57) ABSTRACT

A method of forming a dielectric layer on a further layer of a semiconductor device is disclosed. The method comprises depositing a dielectric precursor compound and a further precursor compound over the further layer, the dielectric precursor compound comprising a metal ion from the group consisting of Yttrium and the Lanthanide series elements, and the further precursor compound comprising a metal ion from the group consisting of group IV and group V metals; and chemically converting the dielectric precursor compound and the further precursor compound into a dielectric compound and a further compound respectively, the further compound self-assembling during said conversion into a plurality of nanocluster nuclei within the dielectric layer formed from the first dielectric precursor compound. The nanoclusters may be dielectric or metallic in nature. Consequently, a dielectric layer is formed that has excellent charge trapping capabilities. Such a dielectric layer is particularly suitable for use in semiconductor devices such as non-volatile memories.

9 Claims, 6 Drawing Sheets

U.S. PATENT DOCUMENTS

| | | |
|---|---|---|
| 7,884,003 B2 * | 2/2011 | Grupp et al. ............... 438/571 |
| 2005/0067651 A1 | 3/2005 | Kim et al. |
| 2005/0077519 A1 | 4/2005 | Ahn et al. |
| 2006/0046384 A1 | 3/2006 | Joo et al. |
| 2007/0057313 A1 | 3/2007 | Kim |
| 2008/0087945 A1 | 4/2008 | Forbes et al. |
| 2008/0095931 A1 | 4/2008 | Lin et al. |
| 2010/0330813 A1 * | 12/2010 | Nakagawa et al. ........... 438/761 |
| 2011/0065287 A1 * | 3/2011 | Wajda ........................ 438/785 |
| 2011/0183527 A1 * | 7/2011 | Cho et al. .................... 438/785 |

* cited by examiner

METHOD OF FORMING A NANOCLUSTER-COMPRISING DIELECTRIC LAYER AND DEVICE COMPRISING SUCH A LAYER

CROSS REFERENCE

This application is a United States national phase of co-pending international patent application No. PCT/IB2009/051656, filed Apr. 22, 2009, which claims priority to European patent application number 08103751.7, filed Apr. 28, 2008, the disclosures of which are incorporated herein by reference.

DESCRIPTION

The present invention relates to a method of forming a nanocluster-comprising dielectric layer on a further layer of a semiconductor device.

The present invention further relates to a semiconductor device comprising such a dielectric layer.

The ongoing miniaturization of semiconductor devices has triggered the development of semiconductor devices with new materials and new designs to overcome problems associated with said miniaturization. For instance, the reduction of the layer thickness of dielectric layers in semiconductor devices such as transistors and memory cells not only increases switching speeds of the devices but also increases leakage current through such a layer. To overcome the leakage current problem, so-called high-k materials have been used as dielectric layers. These materials have a dielectric constant that is substantially higher than the dielectric constant of silicon oxide. Sometimes, a high-k material is defined as a material having a dielectric constant of at least five.

Ideally, a dielectric material combines a high dielectric constant (k) with a high dielectrical breakdown field ($E_{BD}$), e.g. to facilitate the use of such a dielectric material as a gate oxide in a semiconductor device such as a transistor or the dielectric layer in a capacitor. An empirical relationship between these parameters for a homogeneous dielectric film is given by:

$$E_{BD} = \sqrt{\frac{20}{k}} \quad (1)$$

Hence, it can be seen that finding a suitable dielectric material corresponds to finding a good trade-off between the dielectrical breakdown and the dielectric properties of the material. Moreover, it will be apparent that such homogenous materials, whether in an amorphous or a crystalline form, have a performance limit that may prohibit the use of such materials in high-performance application domains and/or future deep submicron technologies.

US2005/0077519 discloses several laminated dielectric layers for semiconductor devices formed from $ZrO_2$ and a lanthanide oxide such as $Pr_2O_3$, $Nd_2O_3$, $Sm_2O_3$, $Gd_2O_3$, $Dy_2O_3$ and $PrTi_xO_y$, wherein x and y are variables in the range of 1.0 x to 0.9-1.0 y. The laminated dielectric layers. The laminated layers, which may be grown using reaction sequence atomic layer deposition techniques (RS-ALD, also known as just ALD), have a relatively high combined dielectric constant, e.g. k=12-24 depending on the thickness of the layers used.

However, a problem is that such laminated dielectric layers exhibit the Maxwell-Wagner effect, which means that that the breakdown field energy of such laminated layers is not improved.

Another problem caused by the ongoing miniaturization of semiconductor devices is the problem of adequate charge retention in a charge retention layer of a semiconductor device such as a non-volatile memory cell. Such a cell may have a floating gate structure embedded in the gate oxide of a CMOS device, where electrons can be stored and withdrawn to write and read information whenever necessary. FIG. 1 depicts a typical prior art non-volatile memory cell having a floating gate arrangement. The cell comprises a substrate 110, in which a source 112 and a drain 116 are separated by a channel 114. A tunnel oxide layer 120 covers the channel 116, with the tunnel oxide layer 120 being covered by a floating gate oxide 130 and a contact gate oxide 140. The tunnel oxide layer may be a high-k oxide material to facilitate the use of a tunnel oxide layer 120 having an increased thickness and improved charge retention behavior. During charging of the non-volatile memory cell, charges 125 tunnel through the tunnel oxide layer 120 by means of a Fowler-Nordheim tunneling process, and accumulate on the interface between the tunnel oxide layer 120 and the floating gate oxide 130. These electrons will remain at the interface until a reverse bias is applied to the drain to withdraw the electrons. This is the erasing mechanism of such a non-volatile memory cell.

One of the problems associated with the continuous miniaturization of the device dimensions is that when the floating gate layer 130 is thinned down, the electrical charges stored at the interface between the floating gate layer 130 and tunnel oxide layer 120 will start to leak away, which threatens the charge retention or the reliability of the cell. Moreover, when the surface area of the cell is also miniaturized, the number of electrical charges that can be stored in the cell is reduced. This also threatens the charge retention or the reliability of the cell.

In a worst-case scenario, which may become reality in deep submicron processes such as CMOS45, the total number of electrons that can be stored in a floating gate layer having dimensions of 45*45*10 nm (length*width*thickness) will be limited to 2.5 electrons per cell, based on the typical interface charge density of $10^{15}$ charges/cm$^2$, and on the assumption that the charge is only accumulating at the aforementioned interface. Moreover, the tunnel oxide below the floating-gate will consume power if the tunnel oxide contains defects that can trap the charges while writing or reading the stored information. These are some of the major obstacles in the miniaturization of non-volatile memory technology.

This problem is not adequately solved by the laminated dielectric layers of US2005/0077519 because charge retention will occur on the interface between the $ZrO_2$ and the lanthanide oxide, which does not increase the charge storage capacity of such a layer.

In US patent application No. 2005/0067651, a method of manufacturing a non-volatile memory cell that employs a plurality of dielectric nanostructures over the tunnel oxide is disclosed. The plurality of nanostructures is formed by depositing a charge trapping dielectric layer over the tunnel oxide and forming nanodots over the charge trapping dielectric layer. The trapping dielectric layer is subsequently patterned into a plurality of pillar-shaped nanostructures using the nanodots as an etch mask, after which a gate dielectric is formed such that the nanostructures are embedded in the dielectric layer. Although this non-volatile memory cell comprises improved charge trapping capabilities, its manufacturing is cumbersome and costly.

The present invention seeks to provide a method of forming an improved dielectric layer on a further layer of a semiconductor device.

The present invention further seeks to provide an improved n semiconductor device.

According to a first aspect of the present invention, there is provided method of forming a dielectric layer on a further layer of a semiconductor device, the method comprising depositing a dielectric precursor compound and a further precursor compound over the further layer, the dielectric precursor compound comprising a metal ion from the group consisting of Yttrium and the Lanthanide series elements, and the further precursor compound comprising a metal ion from the group consisting of group IV and group V metals; and chemically converting the dielectric precursor compound and the further precursor compound into a dielectric compound and a further compound respectively, the further compound self-assembling into a plurality of nanocluster nuclei within the dielectric layer formed from the dielectric precursor compound during said conversion.

It has been found that this combination of such precursor compounds leads to the spontaneous self-assembly of nanoclusters of the group IV or group V metal oxides or metal nitrides, in a dielectric matrix formed by Yttrium or Lanthanide compounds that are dielectric, i.e. non-metallic, in nature, e.g. Yttrium or Lanthanide oxides. Hence, when using this combination of materials, no patterning step is required, thus significantly simplifying the manufacturing process compared to the manufacturing process disclosed in US 2005/0067651. The thus formed nanoclusters may be dielectric or metallic in nature.

Moreover, the higher surface area of the nanoclusters compared to the nanopillar structures of US 2005/0067651 means that the dielectric layer of the present invention has improved charge retention capabilities. In addition, the clusters increase the percolation path for the breakdown of a semiconductor device, the breakdown filed of such a device is increased as well, which means that the dielectric layer of the present invention has improved breakdown properties compared to the laminated layers of US2005/0077519 whilst maintaining a high dielectric constant.

Although the above manufacturing method may be applied to any charge trapping dielectric layer, it is particularly advantageous if the semiconductor further layer comprises a channel region, wherein the dielectric layer is deposited over the channel region, the method further comprising depositing a further dielectric layer over the dielectric layer, thereby forming a non-volatile memory cell exhibiting excellent charge trapping behavior. However, several alternative embodiments include forming a transistor including the dielectric layer of the present invention as a gate oxide or forming a capacitor using the dielectric layer of the present invention as the insulator between the plates. Other suitable examples of semiconductor devices including a dielectric layer in accordance with the present invention will be apparent to the skilled person.

In an embodiment, the metal ion of the dielectric precursor compound is a Lanthanum ion and the metal ion of the further precursor compound is a Zirconium ion. It has been found that the combination of La and Zr induces prominent self-assembly of Zr-based nanoclusters in the La-based matrix. To this end, the dielectric precursor compound may comprise a first organometallic precursor and the further precursor compound comprises a further organometallic precursor. For instance, tris(2,2,6,6-tetramethyl-3,5-heptanedionato)-lanthanum and bis(methyl-η5-cyclopentadienyl)methyl-methoxy(IV)zirconium are suitable precursor compounds.

Preferably, the steps of depositing the dielectric precursor compound, the further precursor compound and the respective chemical conversion steps are discrete steps of a cycle of an atomic layer deposition (ALD) process. It has been found that the use of ALD yields excellent nanocluster self-assembly. However, it is expected that other precursor-based deposition techniques such as chemical vapor deposition (CVD), plasma-enhanced CVD and plasma-assisted ALD will yield similar results because the underlying chemical conversion processes of the precursor compounds in these techniques are similar to ALD.

The ALD process may comprise a plurality of cycles, and the steps of depositing a dielectric precursor compound and chemically converting the dielectric precursor compound may be repeated a number of times prior to depositing the further precursor compound, or the steps of depositing a further precursor compound, and chemically converting the further precursor compound are repeated a number of times prior to a further depositing of the dielectric precursor compound. This way, the ratio between the dielectric material and the nanoclusters can be controlled.

Preferably, in case of using a Zr-based further precursor compound, the Zr content in the dielectric layer is at least 30% by weight of the total metal content of the dielectric layer. It has been found that at this Zr-fraction, the self-assembly of the Zr-based nanoclusters becomes particularly profound.

According to a further aspect of the present invention, there is provided a semiconductor device comprising a dielectric layer comprising a metal from the group containing Yttrium and the Lanthanide series metals, said dielectric layer comprising a plurality of nanoclusters comprising a metal from the group consisting of group IV and group V metals.

Such a semiconductor device having self-assembled nanoclusters in e.g. the metal oxide matrix of the dielectric layer has excellent charge trapping capabilities, because the surfaces of the nanoclusters have charge-trapping properties. Moreover, it is pointed out that because a self-assembled nanocluster typically has a larger surface area to volume ratio than a pillar-shaped nanostructure as disclosed in US 2005/0067651, the nanocluster-based semiconductor device of the present invention has improved charge trapping capabilities compared to this prior art. As has been discussed previously, such a semiconductor device may be any device that comprises a dielectric layer, e.g. a transistor or a capacitor.

In an embodiment, the semiconductor device comprises a channel region covered by the dielectric layer, the dielectric layer being covered by a further dielectric layer. Hence, such a semiconductor device is arranged to operate as a non-volatile memory cell, wherein the dielectric layer functions as a tunnel oxide layer, with the embedded nanoclusters acting as the charge trapping interfaces, thereby providing a non-volatile memory cell having an excellent charge trapping capability.

In an embodiment, the dielectric layer comprises an amorphous $La_2O_3$ matrix, and wherein the nanoclusters comprise $ZrO_2$. Preferably, the Zr content in the dielectric layer is at least 30% by weight, as previously explained.

A plurality of semiconductor devices according to the present invention may form a memory device. Such a memory device has excellent charge retention characteristics, and therefore provides a suitable design for further miniaturization of the technology in which the memory device is realized.

Embodiments of the invention are described in more detail and by way of non-limiting examples with reference to the accompanying drawings, wherein:

FIG. 1 schematically depicts a prior art non-volatile memory cell design;

FIG. 2a-f schematically depicts the ALD process;

FIG. 3 schematically depicts a semiconductor device obtained by the method of the present invention;

It should be understood that the Figures are merely schematic and are not drawn to scale. It should also be understood that the same reference numerals are used throughout the Figures to indicate the same or similar parts.

Figure 2A:
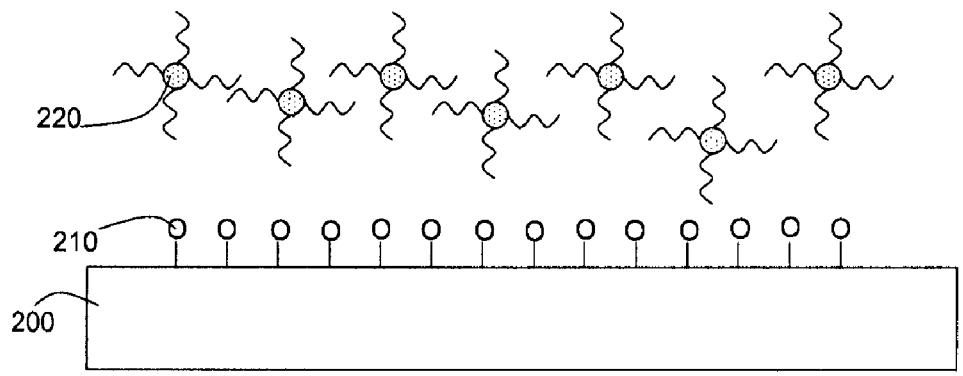

FIG. 2a-f schematically depict the formation of a dielectric layer using ALD. In FIG. 2a, a functionalized substrate 200 has a surface 210 carrying hydroxyl groups. A dielectric precursor material 220 comprising a reactive compound such as a metal ion surrounded by organic ligands or other suitable substituents, e.g. halides, is pulsed over the surface 210 of the substrate 200.

Figure 2B:
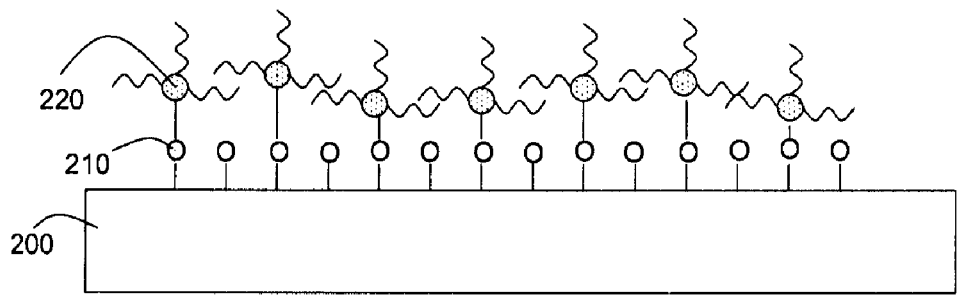

As shown in FIG. 2b, this causes a chemical reaction in which a substituent is removed from the dielectric precursor compound 220 and replaced with a bond between the metal ion in the dielectric precursor compound 220 and an hydroxyl group of the substrate surface 210. Such a reaction may change the oxidation state of the metal ion. The reaction is typically driven by the fact that the metal-ligand bond is a relatively weak bond, with the metal having a higher affinity for binding to an oxygen atom, such that the overall Gibbs free energy ($\Delta G$) of the reaction is negative. The effective coverage of the surface 210 with the dielectric precursor compound 220 depends on a number of factors, such as ligand size and duration of the exposure of the substrate surface 210.

Figure 2C:
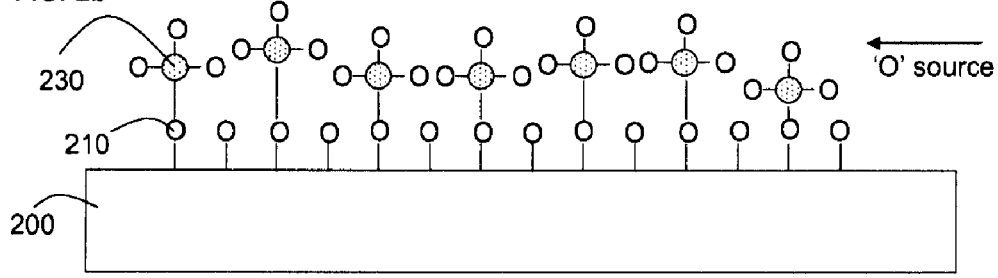

In a next step, as shown in FIG. 2c, the substrate may be exposed to an oxide source, e.g. $H_2O$, $O_3$, plasma-generated oxygen radicals or another suitable oxygen source, which replaces the remaining substituents of the dielectric precursor compound 220 with oxygen, thereby forming a dielectric layer 230 over the substrate surface 210. It is reiterated that this dielectric layer 230 may only be incompletely covered because of a lack of reactive hydroxyl groups on the surface 210 or because of steric hindrance between the ligands of the dielectric precursor compound 220 prohibiting the reaction with each of the available reactive groups on the surface 210. Therefore, the steps shown in FIG. 2a-c may be repeated a number of times to grow the dielectric layer to a sufficient coverage and/or thickness.

Figure 2D:
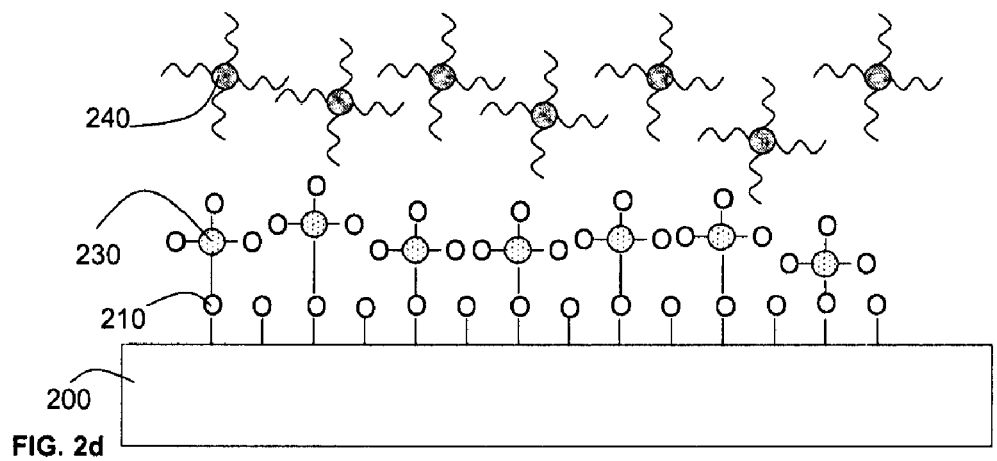
Figure 2E:
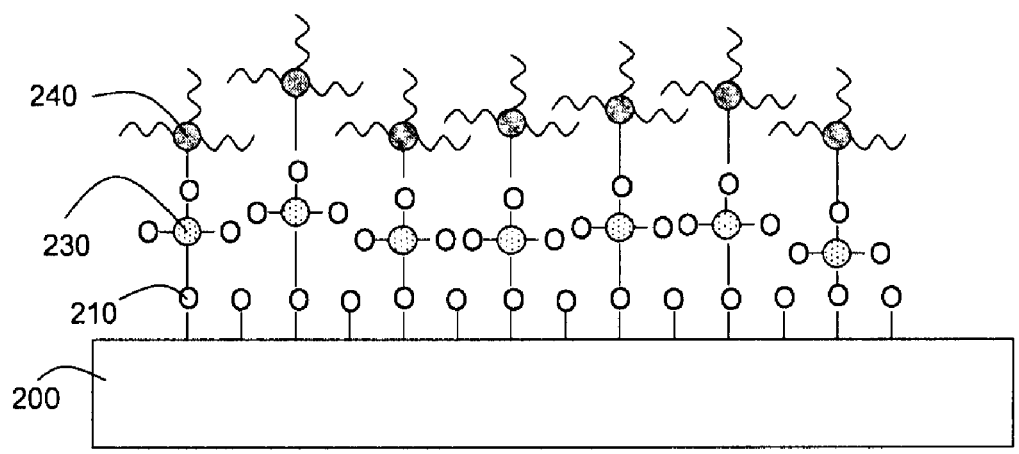
Figure 2F:
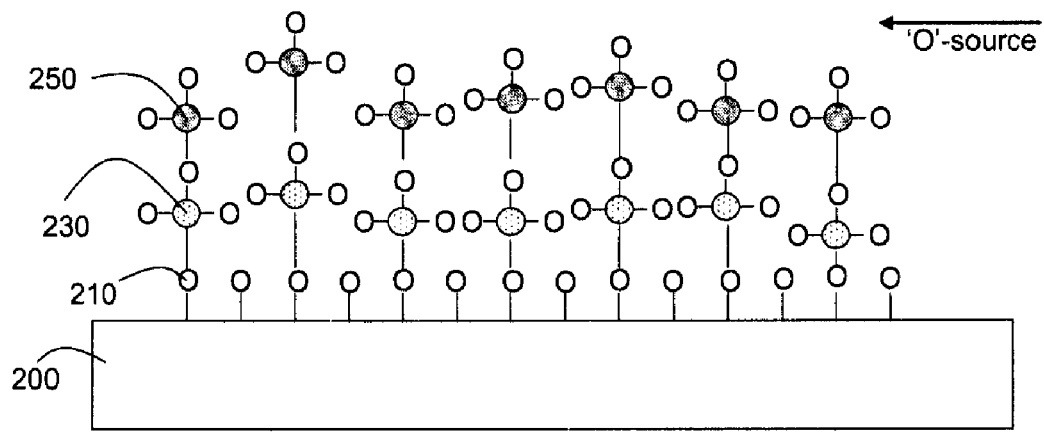

Next, a different dielectric may be grown over the dielectric layer 230. To this end, the steps depicted in FIG. 2a-c may be repeated but with using a further dielectric precursor compound 240, as shown in FIG. 2D. This further dielectric precursor compound 240 reacts with the available oxide sites of the dielectric layer 220 and/or the surface 210 of the substrate 200, as shown in FIG. 2e, after which the further dielectric precursor compound 240 is converted into a further dielectric material 250 by exposure to an oxide source, as shown in FIG. 2f. The steps shown in FIG. 2d-2f may be repeated a number of times, e.g. in order to improve coverage of the dielectric layer 230 by the further dielectric material 250 and/or to increase the thickness or weight fraction of the further dielectric material 250, before repeating the steps shown in FIG. 2a-c.

It will be obvious to the skilled person that although the above ALD process has been described in terms of reaction of the precursor compounds 220 and 240 with an oxygen source, the process is applicable for reacting the precursor compounds with any substituent that causes the replacement of a ligand of the precursor compounds, e.g. nitrides. In such a case, the oxygen source in FIG. 2c and FIG. 2f may be replaced with a nitrogen source, e.g. $NH_3$.

In accordance with the present invention, it has been found that if the metal ion in the first dielectric precursor compound 220 is chosen from the group containing Yttrium and the Lanthanide elements, and the metal ion in the further dielectric precursor compound 240 is chosen from the group IV and group V elements, the conversion reactions of FIG. 2c and FIG. 2f cause a nucleation process in the further dielectric material 250, thus leading to the self-assembly of the further dielectric material 250 into nanoclusters within the matrix of the first dielectric material 230. This has been demonstrated for a La-containing first dielectric precursor compound 220, and for a Zr-containing further dielectric precursor compound 240, and similar behavior is expected if alternative elements from the respective groups are chosen, because of the well-known similarities in the behavior between the different elements from the respective groups. Various examples of such a process are given below.

EXAMPLE

Thin films of $La_2O_3$ and $ZrO_2$ with different La:Zr pulse ratios (1:0, 12:1, 4:1, 1:1, 1:4, 1:9 and 0:1) were deposited on p-type 200 nm Si (100) substrates with a resistivity of 3-10 $\Omega$-cm in an ASM hot-wall, cross-flow PULSAR® 2000 ALCVD reactor. Tris(2,2,6,6-tetramethyl-3,5-heptanedionato) lanthanum, $La(thd)_3$, and bis(methyl-5η-cyclopentadienyl)methyl methoxy(IV)zirconium, ZrD-04, were used as precursors for the $La_2O_3$ and $ZrO_2$ deposition, respectively, with ozone ($O_3$) as the oxidizing agent. The thin films were deposited at a temperature of 300° C. Oxidation of the thin films led to the formation of a $La_yZr_{1-y}O_x$ layer in which different phases of $La_2O_3$ and $ZrO_2$ could be detected. The composition of the $La_yZr_{1-y}O_x$ layers was varied by changing the pulse ratio of the $La(thd)_3$ and the ZrD-04 precursor. Different deposition rates and nucleation behavior of $La_2O_3$ and $ZrO_2$ on top of each other result in samples with different thickness. It has been found that the $ZrO_2$ nanocluster embedded $La_2O_3$ layer exhibits a dielectric constant of around 40, whilst further exhibiting excellent breakdown characteristics (vide infra).

Figure 1:
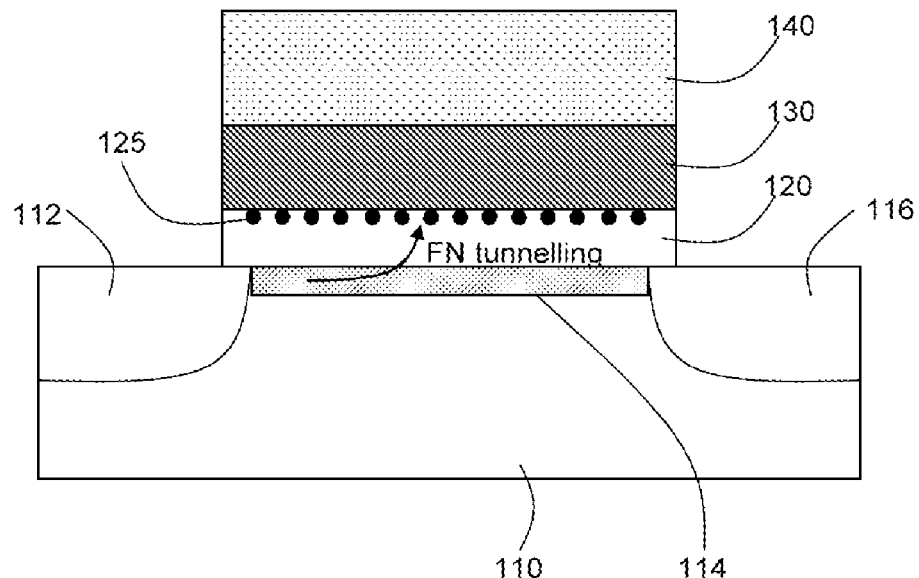
Figure 3:
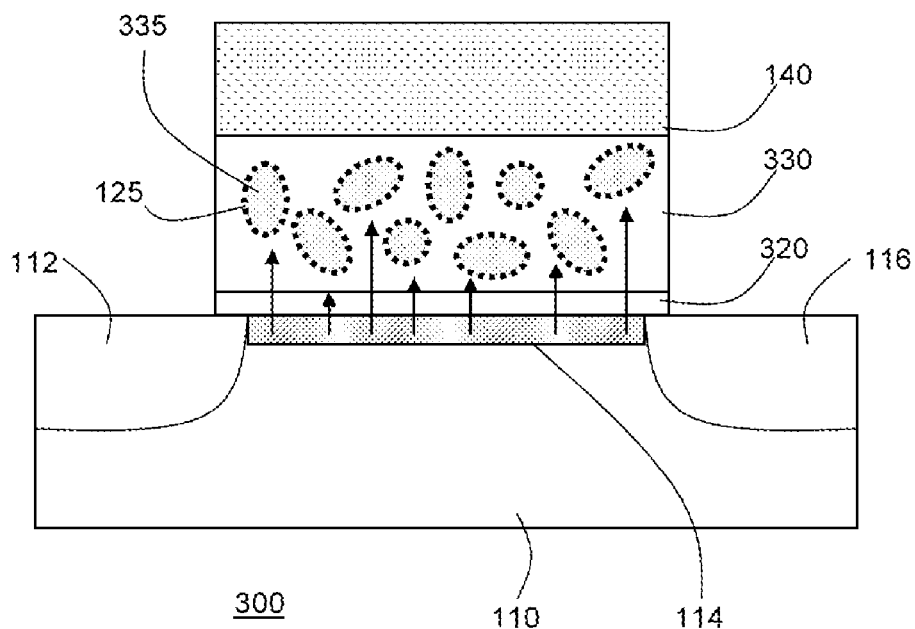

FIG. 3 schematically depicts a semiconductor device 300 comprising a $La_2O_3$ dielectric layer 330 in which self-assembled $ZrO_2$ clusters 340 are embedded. This dielectric layer may be obtained by the aforementioned example. The semiconductor device 300 in FIG. 3 is a non-volatile memory cell, but it will be appreciated that the present invention is not limited to non-volatile memory cells but may be applied to any device requiring a charge retention layer, e.g. a capacitive device. The semiconductor device 300 further comprises a substrate 110 in which a source 112 and a drain 116 are separated by a channel 114. The substrate 110 may be any suitable substrate, and the source 112, channel 114 and drain 116 may be formed in any suitable manner. These processing steps are not at the heart of the present invention.

The semiconductor device 220 comprises a tunnel oxide layer 320 between the dielectric layer 330 and the channel 114. The tunnel oxide layer 320 may be a separate oxide layer of any suitable material, e.g. a high-k material. For instance, $La_2O_3$ is a suitable high-k material because a 40 nm thick $La_2O_3$ layer has an equivalent $SiO_2$ oxide thickness of 10 nm. Hence, such high-k materials can be used to form a much thicker tunnel oxide layer without increasing the equivalent $SiO_2$ thickness, thereby reducing the tunneling-induced charge leakage through said layer. Alternatively, the tunnel oxide layer 320 may be a region of the dielectric layer 330, which may be achieved by repeating the La-precursor pulses in the ALD process a number of times prior to application of the first Zr-precursor pulse. In this embodiment, the dielectric layer 330 also functions as the tunnel oxide 320, with the charge retention 'layer' being formed by $ZrO_2$ charge retention nanoclusters 335 inside the amorphous $La_2O_3$ matrix 330. The dielectric layer 330 is typically covered by any suitable contact gate oxide 140.

The crystalline $ZrO_2$ nanoclusters 335 form spontaneously in a nucleation process during the conversion of the Zr-containing precursor into $ZrO_2$. Tetragonal $ZrO_2$ crystals appear to dominate the crystalline form. It has been found that the thus formed nanocluster 335 embedded dielectric layer 330 is thermally stable. This has been tested by exposing the layer 330 to several annealing steps at T=400° C., which did not lead to any noticeable degradation of the dielectric layer 330 or the nanoclusters 335 therein.

The crystalline $ZrO_2$ clusters inside the $La_2O_3$ matrix can be kept as small as 2 nm in the ALD process, thus providing charge retention nanoclusters having a superior surface to volume ratio compared to the nanoclusters of the prior art nanocluster device disclosed in US 2005/0067651. This is important, because the charges 125 that tunnel through the tunnel oxide 320 accumulate at the surface area of the nanoclusters 335, which means that the nanocluster nuclei 335 of the present invention can retain more charges per unit volume.

A further distinction between the nanoclusters of US 2005/0067651 and the present invention is that the symmetry axis of a nanocluster crystal 335 will have an orientation that is independent of the orientation of the symmetry axis of another nanocluster crystal 335, thus yielding a random distribution of said axes through the dielectric layer 330, whereas the nanoclusters of US 2005/0067651 typically share the same orientation of the symmetry axis.

Figure 4:
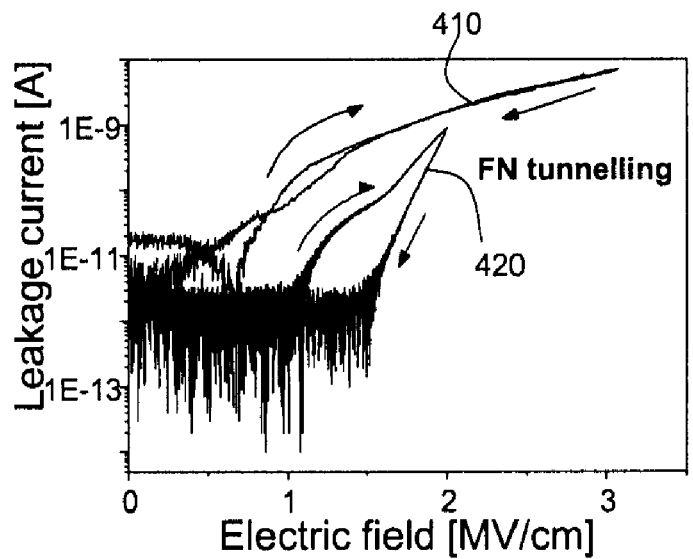
FIG. 4 depicts the effect on the leakage current through a prior art dielectric layer and a dielectric in accordance with the present invention.

FIG. 4 depicts the effect on the leakage current through a La2O3 thin film 410 and a La2O3 thin film 420 comprising $ZrO_2$ nanoclusters 335 as a function of an applied electric field across the thin films. The La:Zr ratio in the film 420 is 1:1. It is clear that a hysteresis effect occurs in the $La_2O_3$ thin film 420 comprising $ZrO_2$ nanoclusters 335. This is caused by the trapping of charges on the surface of the nanoclusters 335.

Variations in the number of ALD cycles can be used to vary the thickness of the dielectric layer 330. The effect of the variations is given in Table I, in which both the number of ALD cycles and the pulse ratio per ALD cycle has been varied.

TABLE I

| La:Zr pulse ratio | RBS La/La + Zr (%) | XPS La/La + Zr (%) | Mean thickness from ellipsometry (nm) |
|---|---|---|---|
| 1:0 | 100 | 100 | 13 |
| 4:1 | 58.1 | 53.40 | 22 |
| 1:1 | 26.4 | 24.20 | 24 |
| 1:4 | 8.3 | 8.80 | 32 |
| 1:9 | 1.9 | — | 37 |
| 0:1 | 0 | 0 | 22 |

The first column in Table I lists the pulse ratio, i.e. the number of contiguous repetitions of deposition and conversion of the precursor compound of the one metal before depositing the precursor compound of the other metal. The second and third column lists the ratio of La over La+Zr as determined by Rutherford back scattering spectroscopy (RBS) and X-ray photoelectron spectroscopy (XPS) respectively, and the fourth column lists the average layer thickness of the dielectric layer 330 as determined by ellipsometry by determining the thickness at 24 different locations of the dielectric layer 330. The thickness variation in the various layers listed in Table I was less than ±5%.

Table I clearly demonstrates that, the formation of the nanoclusters 335 can be achieved in dielectric layers 330 having different thicknesses.

Figure 5:
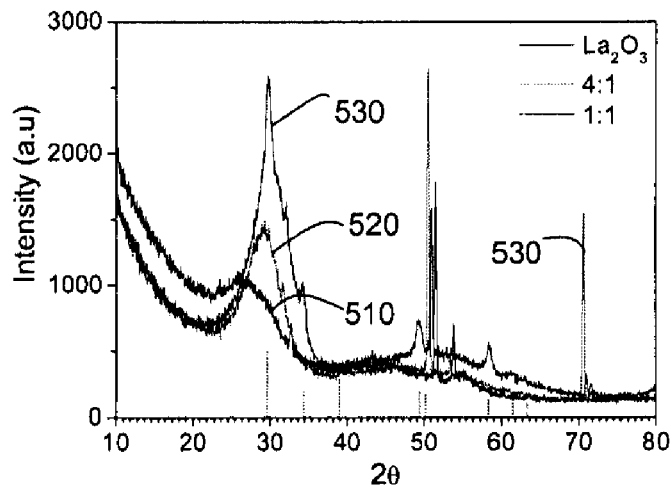
FIGS. 5 and 6 depict the X-ray diffraction spectra of a dielectric layer formed in accordance with the present invention at various La:Zr ratios.
Figure 6:
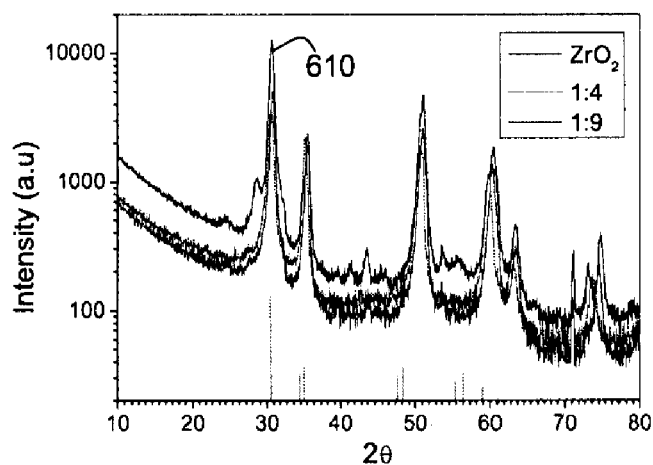

FIGS. 5 and 6 depict the X-ray diffraction spectra of the dielectric layer 330 at various La:Zr ratios. The lines protruding from the X-axis indicate the theoretical diffraction lines of tetragonal $ZrO_2$. In FIG. 5, the spectra of dielectric layers 330 having a 1:0 La:Zr ratio (spectral line 510), a 4:1 La:Zr ratio (spectral line 520) and a 1:1 La:Zr ratio (spectral line 530) are compared. It can be seen from the spectral lines at 2θ≈30° that an increase in the intensity of the diffraction at this phase angle is obtained with increasing Zr-content in the dielectric layer 330. This diffraction corresponds with the theoretically predicted diffraction line of tetragonal $ZrO_2$, thus providing a clear indication of the formation of $ZrO_2$ clusters in the $La_2O_3$ matrix.

In FIG. 6, the spectra of dielectric layers 330 having a 1:4 La:Zr ratio, a 1:9 La:Zr ratio and a 0:1 La:Zr ratio (spectral line 610) are compared. It is immediately apparent that the diffraction spectra are substantially similar, thus providing clear evidence of the occurrence of large amounts of tetragonal $ZrO_2$ in the dielectric layer 330.

A crude estimation of the $ZrO_2$ cluster sizes can be obtained using the Debye-Scherrer formula. This formula gives the relation between the half-width β (the width of the diffraction peak at which the intensity has fallen to half the maximum intensity) and the length of the crystal normal to the reflecting plane of X-rays on a (ideally cubic) crystal surface, as:

$$D = \frac{0.94\lambda}{\beta \cos\theta}$$

Figure 7:
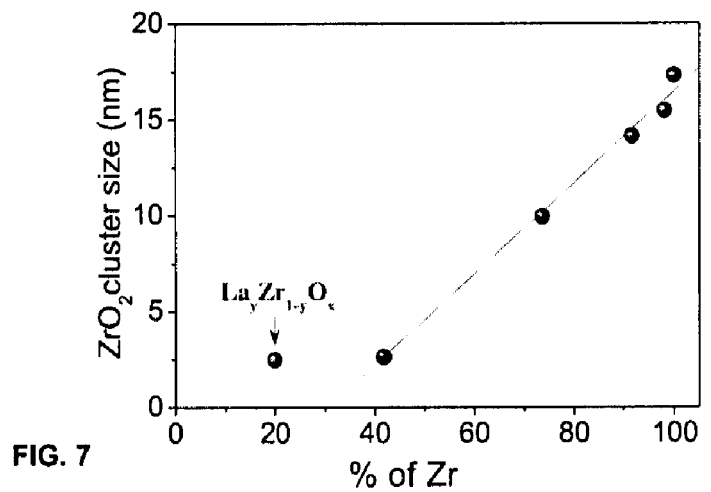
FIG. 7 depicts a predicted correlation between the Zr content in a dielectric layer formed in accordance with the present invention and the size of the self-assembled nanoclusters.

The results of this estimation are depicted in FIG. 7, which shows the $ZrO_2$ cluster size as a function of the Zr content as a weight percentage of the total metal content (i.e. La+Zr). FIG. 7 clearly predicts a linear correlation between the cluster size of the tetragonal $ZrO_2$ nanoclusters 335 and the Zr content. Based on this correlation, it is predicted that the overall Zr-content should be at least 30% to obtain $ZrO_2$ nanoclusters 335 in the $La_2O_3$ dielectric layer 330. Such a content can be obtained in an ALD process by employing a La:Zr pulse ratio of at most 9:1, i.e. no more than 9 $La_2O_3$ precursor pulses per $ZrO_2$ precursor pulse, for the precursors used in the above example. If the Zr-content is lower than 30%, a uniform $La_yZr_{1-y}O_x$ layer may be obtained for these precursors, at least as predicted by the Debye-Scherrer formula. In an embodiment, the La:Zr pulse ratio is selected in the range from 9:1 to 1:9, since in this range $ZrO_2$ nanoclusters are formed with particularly good surface to volume ratios.

However, it should be understood that this ratio is specific to the precursor compounds used in the given example, and that different precursor compounds may require a different preferential pulse ratio and nanocluster metal content.

At this point, it is noted that it is believed that the driving force between the formation of the nanoclusters is the tendency of the material forming the nanoclusters to form a crystalline layer structure. This tendency is combined with ensuring, e.g. in the ALD pulse process, that either the dielectric layer precursor and/or the nanocluster precursor is deposited in an insufficient number of consecutive cycles to fully cover the underlying layer or substrate, such that islands of a precursor rather than a fully covering precursor layer are deposited over the underlying layer. This is believed to trigger the self-assembly of the further precursor into crystalline nanoclusters, since this is considered to be a more stable configuration that a configuration in which scattered islands of the nanocluster precursor are formed. To this end, it is preferably that the pulse ratio of the dielectric precursor and the further precursor compound is unbalanced, e.g. 4:1 or 1:9 such that at least one of the compounds cannot form a fully covering layer.

In contrast, since US2005/0077519 targeted the formation of laminated layers having a thickness of several nanometers, typically several pulse consecutive cycles were applied for each of the layers, thereby ensuring a full coverage of a previous layer by the subsequent layer, in which case the formation of the nanoclusters will not be observed, for the reasons explained above.

It is envisaged that many suitable precursor compounds may be used to form the dielectric or metallic nanoclusters 335 in the dielectric layer 330. For instance, other cyclopentadienyl-based ligands, Zr halides, Hf halides and tetrakis (ethylmethylamino)-Zr (Zr-TEMA).

Figure 8:
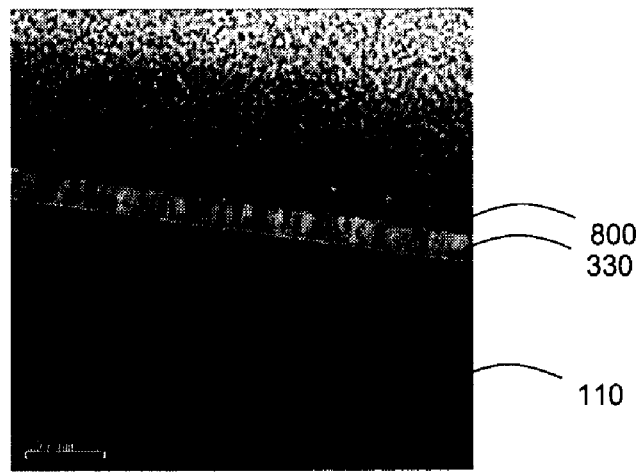
FIG. 8 depicts a HRTEM image of a dielectric layer formed in accordance with the present invention.

FIG. 8 depicts a high resolution transmission electron microscope (HRTEM) image of a dielectric layer 330 having a La:Zr ratio of 1:4. The layer 800 is a Pt electrode deposited over the dielectric layer 330. The dark spots in the dielectric layer indicate the presence of the $ZrO_2$ nanoclusters 335, thus providing evidence that the nanoclusters actually self-assemble if the Zr-content is 30%.

Figure 9:
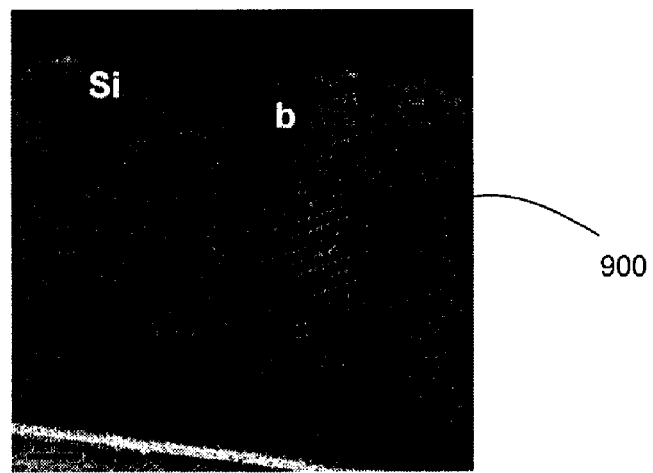
FIG. 9 depicts another HRTEM image of a dielectric layer formed in accordance with the present invention.

FIG. 9 depicts a HRTEM image of the nanoclusters 335 of FIG. 8, in which a Moiré pattern 900 is clearly visible. This is caused by the different orientations of the nanoclusters 335 in the dielectric layer 330.

Figure 10:
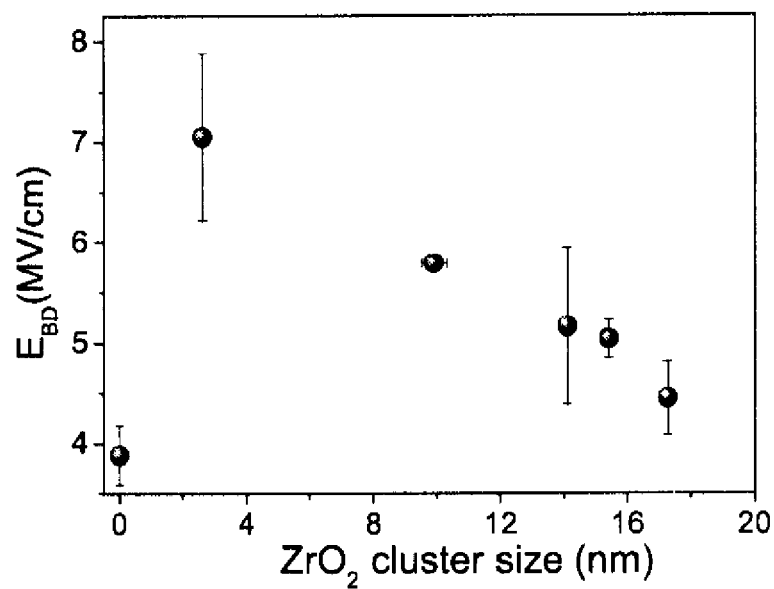
FIG. 10 depicts the relationship between the $ZrO_2$ cluster size in the $La_2O_3$ dielectric layer and the breakdown electric field.

FIG. 10 depicts a direct relationship between the $ZrO_2$ cluster size in the $La_2O_3$ dielectric layer and the breakdown electric field. The x-axis shows the average $ZrO_2$ cluster diameter in nm and the y-axis shows the breakdown energy of the $La_2O_3$ dielectric layer in MV/cm. To optimize the breakdown characteristics of the dielectric layer, the cluster size should be kept small, clearly indicating a relationship between the total surface area of the nanoclusters and the breakdown energy.

Figure 11:
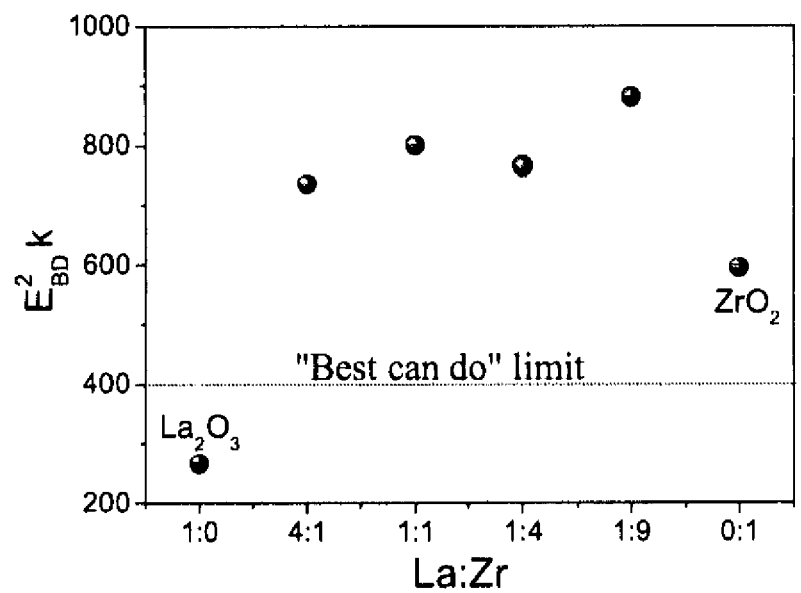
FIG. 11 depicts the electrical performance of the $ZrO_2$ nanocluster embedded $La_2O_3$ with different La:Zr pulse ratios.

FIG. 11 depicts the electric performance of the various $La_2O_3$ dielectric layers having different La:Zr ratios. $ZrO_2$ nanoclusters are present in the depicted $La_2O_3$ dielectric layer for the 4:1, 1:1, 1:4 and 1:9 ratios. The y-axis shows the product of the $E_{BD}^2$ and k, with the horizontal line indicating the theoretical best-can-do limit for a dielectric layer as governed by equation (1), which is a value at which the product $E_{BD}^2 \cdot k$ assumes a maximum value, thereby indicating a best possible trade-off between breakdown performance and dielectric constant of the dielectric material of interest. It is clearly demonstrated that the presence of $ZrO_2$ nanoclusters in the $La_2O_3$ dielectric layer causes the dielectric layer to have an electric performance that outperforms the theoretical 'best-can-do' limit.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method of forming a dielectric layer on a further layer of a semiconductor device, the method comprising:
   depositing a dielectric precursor compound and a further precursor compound over the further layer, the dielectric precursor compound comprising a metal ion from the group consisting of Yttrium and the Lanthanide series elements, and the further precursor compound comprising a metal ion from the group consisting of group IV and group V metals; and
   chemically converting the dielectric precursor compound and the further precursor compound into a dielectric compound and a further compound respectively, the further compound self-assembling during said conversion into a plurality of nanocluster nuclei within the dielectric layer formed from the dielectric precursor compound.

2. A method according to claim 1, wherein the further layer comprises a channel region, wherein the dielectric layer is deposited over the channel region, the method further comprising depositing a further dielectric layer over the dielectric layer.

3. A method according to claim 1, wherein the metal ion of the dielectric precursor compound is a Lanthanum ion and the metal ion of the further precursor compound is a Zirconium ion.

4. A method as claimed in claim 3, wherein the dielectric precursor compound comprises a first organometallic precursor, preferably tris(2,2,6,6-tetramethyl-3,5-heptanedionato)-lanthanum, and the further precursor compound comprises a further organometallic precursor, preferably bis(methylη5-cyclopentadienyl)methyl-methoxy(IV)zirconium.

5. A method according to claim 1, wherein the steps of depositing the dielectric precursor compound, the further precursor compound and the respective chemical conversion steps are discrete steps of a cycle of an atomic layer deposition process.

6. A method according to claims 5, wherein the atomic layer deposition process comprises a plurality of cycles.

7. A method according to claim 1, wherein the steps of depositing a dielectric precursor compound and chemically converting the dielectric precursor compound are repeated a number of times prior to depositing the further precursor compound.

8. A method according to claim 1, wherein the steps of depositing a further precursor compound, and chemically converting the further precursor compound are repeated a number of times prior to a further depositing of the dielectric precursor compound.

9. A method according to claim 8, wherein the Zr-content in the dielectric layer is at least 30% by weight of the total metal content of the dielectric layer.

* * * * *